United States Patent
Yoo et al.

(10) Patent No.: US 10,147,713 B2
(45) Date of Patent: *Dec. 4, 2018

(54) SEMICONDUCTOR PACKAGE HAVING MOLD LAYER WITH CURVED CORNER AND METHOD OF FABRICATING SAME

(71) Applicant: SAMSUNG ELECTRONICS CO., LTD., Suwon-si, Gyeonggi-do (KR)

(72) Inventors: Hyein Yoo, Pyeongtaek-si (KR); Yeongseok Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/889,957

(22) Filed: Feb. 6, 2018

(65) Prior Publication Data

US 2018/0158810 A1    Jun. 7, 2018

Related U.S. Application Data

(63) Continuation of application No. 15/355,476, filed on Nov. 18, 2016, now Pat. No. 9,929,131.

(30) Foreign Application Priority Data

Dec. 18, 2015    (KR) .................. 10-2015-0181883

(51) Int. Cl.
*H01L 25/00*    (2006.01)
*H01L 21/56*    (2006.01)
(Continued)

(52) U.S. Cl.
CPC ............ *H01L 25/50* (2013.01); *H01L 21/561* (2013.01); *H01L 21/565* (2013.01); *H01L 21/78* (2013.01);
(Continued)

(58) Field of Classification Search
CPC ..... H01L 23/28; H01L 23/31; H01L 23/3107; H01L 23/3114; H01L 23/3121;
(Continued)

(56) References Cited

U.S. PATENT DOCUMENTS 4,909,901 A    3/1990 McAllister et al.
5,043,534 A    8/1991 Mahulikar et al.
(Continued)

FOREIGN PATENT DOCUMENTS

JP    H 09321164 A    12/1997
JP    2005-032970 A    2/2005
(Continued)

OTHER PUBLICATIONS

Co-pending U.S. Appl. No. 15/355,476; Yoo et al.; filed Nov. 18, 2016.*

*Primary Examiner* — Scott B Geyer
(74) *Attorney, Agent, or Firm* — Lee & Morse, P.C.

(57) ABSTRACT

A method of fabricating a semiconductor package includes mounting a plurality of semiconductor chips on a substrate in a stripped state, forming a mold layer to cover the semiconductor chips, cutting the mold layer and the substrate to form unit packages separated from each other, and forming a shielding layer on the mold layer of each of the unit packages, wherein each of the unit packages includes a corresponding one of the semiconductor chips, wherein the mold layer in each of the unit packages includes side surfaces, a top surface, and corner regions, and wherein each of the corner regions of the mold layer includes a first corner, which is connected to a corresponding one of the side surfaces and has a first curvature radius, and a second corner, which is connected to the top surface and has a second curvature radius smaller than the first curvature radius.

20 Claims, 16 Drawing Sheets

(51) Int. Cl.
  *H01L 21/78* (2006.01)
  *H01L 23/31* (2006.01)
  *H01L 25/065* (2006.01)
  *H01L 23/552* (2006.01)

(52) U.S. Cl.
  CPC ........ *H01L 23/3128* (2013.01); *H01L 23/552* (2013.01); *H01L 25/0657* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01); *H01L 2225/06524* (2013.01); *H01L 2225/06537* (2013.01); *H01L 2225/06568* (2013.01); *H01L 2225/06589* (2013.01); *H01L 2924/15311* (2013.01); *H01L 2924/1815* (2013.01); *H01L 2924/3025* (2013.01)

(58) Field of Classification Search
  CPC ...... H01L 23/585; H01L 21/56–21/568; H01L 23/3192; H01L 23/16–23/26; H01L 23/42–23/4338; H01L 23/60–23/62; H01L 23/552–23/556
  See application file for complete search history.

(56) References Cited

U.S. PATENT DOCUMENTS

| | | | |
|---|---|---|---|
| 5,060,114 A | 10/1991 | Feinberg et al. | |
| 5,164,897 A | 11/1992 | Clark et al. | |
| 5,311,019 A | 5/1994 | Gammarino | |
| 5,598,034 A | 1/1997 | Wakefield | |
| 5,703,761 A | 12/1997 | Heiss | |
| 5,739,887 A | 4/1998 | Ueda et al. | |
| 6,187,613 B1 | 2/2001 | Wu et al. | |
| 6,492,194 B1 | 12/2002 | Bureau et al. | |
| 6,822,880 B2 | 11/2004 | Kovacs et al. | |
| 6,908,665 B2 | 6/2005 | Rea et al. | |
| 6,926,288 B2 | 8/2005 | Bender | |
| 7,109,410 B2 | 9/2006 | Arnold et al. | |
| 7,147,447 B1 | 12/2006 | Takahashi | |
| 7,202,552 B2 | 4/2007 | Zhe et al. | |
| 7,319,396 B2 | 1/2008 | Homanfar et al. | |
| 7,576,415 B2 | 8/2009 | Cha et al. | |
| 7,692,288 B2 | 4/2010 | Zhe et al. | |
| 7,964,938 B2 | 6/2011 | Yoon et al. | |
| 8,013,404 B2 | 9/2011 | Zhe et al. | |
| 8,106,425 B2 | 1/2012 | Choi et al. | |
| 8,199,045 B1 | 6/2012 | Rodgers et al. | |
| 8,212,340 B2 | 7/2012 | Liao | |
| 8,319,318 B2 | 11/2012 | Nalla et al. | |
| 8,335,084 B2 | 12/2012 | Lee et al. | |
| 8,410,584 B2 | 4/2013 | An et al. | |
| 8,424,200 B2 | 4/2013 | Gupta et al. | |
| 8,507,324 B2 | 8/2013 | Nalla et al. | |
| 8,513,781 B2 | 8/2013 | Yoo et al. | |
| 8,576,574 B2 | 11/2013 | Wong et al. | |
| 8,736,030 B2 | 5/2014 | Yao et al. | |
| 8,866,280 B2 | 10/2014 | Choi et al. | |
| 8,921,993 B2 | 12/2014 | Choi et al. | |
| 8,963,298 B2 | 2/2015 | Yao et al. | |
| 9,184,140 B2 | 11/2015 | Choi et al. | |
| 9,190,387 B2 | 11/2015 | Yao et al. | |
| 9,627,327 B2 | 4/2017 | Lee et al. | |
| 2003/0062610 A1 | 4/2003 | Kovacs et al. | |
| 2003/0138991 A1 | 7/2003 | Kung | |
| 2004/0080917 A1 | 4/2004 | Steddom et al. | |
| 2008/0014678 A1 | 1/2008 | Howard et al. | |
| 2008/0128890 A1 | 6/2008 | Choi et al. | |
| 2009/0085231 A1 | 4/2009 | Chiu et al. | |
| 2009/0145332 A1 | 6/2009 | Wheeler | |
| 2009/0184404 A1 | 7/2009 | Jow | |
| 2010/0206378 A1 | 8/2010 | Erickson, Jr. et al. | |
| 2011/0006408 A1 | 1/2011 | Liao | |
| 2011/0054090 A1 | 3/2011 | Fujita | |
| 2011/0115060 A1 | 5/2011 | Chiu et al. | |
| 2011/0115066 A1 | 5/2011 | Kim et al. | |
| 2011/0316117 A1 | 12/2011 | Kripesh et al. | |
| 2012/0052630 A1 | 3/2012 | Lin et al. | |
| 2012/0126381 A1 | 5/2012 | Ueda et al. | |
| 2012/0229977 A1 | 9/2012 | Hosking et al. | |
| 2013/0082368 A1 | 4/2013 | Kim et al. | |
| 2013/0249763 A1 | 9/2013 | Hsu | |
| 2013/0265117 A1 | 10/2013 | Ng et al. | |
| 2014/0124906 A1 | 5/2014 | Park et al. | |
| 2014/0346654 A1 | 11/2014 | Choi et al. | |
| 2015/0016080 A1 | 1/2015 | Lung et al. | |
| 2015/0118792 A1 | 4/2015 | Kawamori et al. | |
| 2015/0129874 A1 | 5/2015 | Choi et al. | |
| 2015/0155240 A1 | 6/2015 | Yao et al. | |
| 2015/0194387 A1 | 7/2015 | Yazar et al. | |
| 2017/0179040 A1 | 6/2017 | Dias et al. | |
| 2017/0186699 A1 | 6/2017 | Li et al. | |
| 2017/0186708 A1 | 6/2017 | Li et al. | |

FOREIGN PATENT DOCUMENTS

| | | |
|---|---|---|
| KR | 10-2013-0127103 A | 11/2013 |
| KR | 10-2014-0111975 A | 9/2014 |

* cited by examiner

SEMICONDUCTOR PACKAGE HAVING MOLD LAYER WITH CURVED CORNER AND METHOD OF FABRICATING SAME

CROSS-REFERENCE TO RELATED APPLICATIONS

This is a continuation application based on pending application Ser. No. 15/355,476, filed Nov. 18, 2016, the entire contents of which is hereby incorporated by reference.

Korean Patent Application No. 10-2015-0181883, filed on Dec. 18, 2015, in the Korean Intellectual Property Office, and entitled: "Method of Fabricating a Semiconductor Package," is incorporated by reference herein in its entirety.

BACKGROUND

1. Field

The present disclosure relates to a semiconductor package, and in particular, to a method of fabricating a semiconductor package, in which a mold layer with a rounded corner is provided.

2. Description of the Related Art

As the mobile market is expanded, many researches on an electromagnetic wave in electronic devices are being actively conducted. In the case that a plurality of semiconductor packages are mounted on the electronic device, electromagnetic waves emitted from each semiconductor package may cause electromagnetic interference (EMI) in other semiconductor packages. As a result of the EMI, the electronic device may suffer from several technical failures (e.g., malfunction or operational failures).

In addition, various types of semiconductor packages have been developed to meet an increasing demand for a high speed and high density semiconductor package, but the EMI remains as an unresolved issue in the semiconductor packages.

SUMMARY

Embodiments provide a semiconductor package with a shielding layer. Embodiments also provide a method of transferring a shielding film on a mold layer with a rounded corner and a method of fabricating a semiconductor package using the same.

According to some embodiments, a method of fabricating a semiconductor package may include mounting a plurality of semiconductor chips on a substrate in a stripped state, forming a mold layer to cover the semiconductor chips, cutting the mold layer and the substrate to form unit packages separated from each other, and forming a shielding layer on the mold layer of each of the unit packages. Each of the unit packages may include a corresponding one of the semiconductor chips, and the mold layer in each of the unit packages may include side surfaces, a top surface, and corner regions. Each of the corner regions may include a first corner, which is connected to a corresponding one of the side surfaces and has a first curvature radius, and a second corner, which is connected to the top surface and has a second curvature radius smaller than the first curvature radius.

According to some embodiments, a method of fabricating a semiconductor package may include providing a plurality of unit packages, each of which includes a semiconductor chip mounted on a substrate and a mold layer covering the semiconductor chip, in a chamber, providing a heating plate and a shielding film, which is attached on a bottom surface of the heating plate, on the chamber, moving the heating plate to be in contact with the chamber and to seal the chamber, and supplying air toward the shielding film through holes provided in the heating plate to transfer the shielding film onto the mold layer.

According to some embodiments, a method of fabricating a semiconductor package may include mounting a plurality of semiconductor chip stacks on a substrate in a stripped state, forming mold layers to cover the semiconductor chip stacks, such that a mold layer covering each semiconductor chip stack includes curved corner regions, forming a shielding layer on each mold layer, such that the shielding layer traces conformally a corresponding mold layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
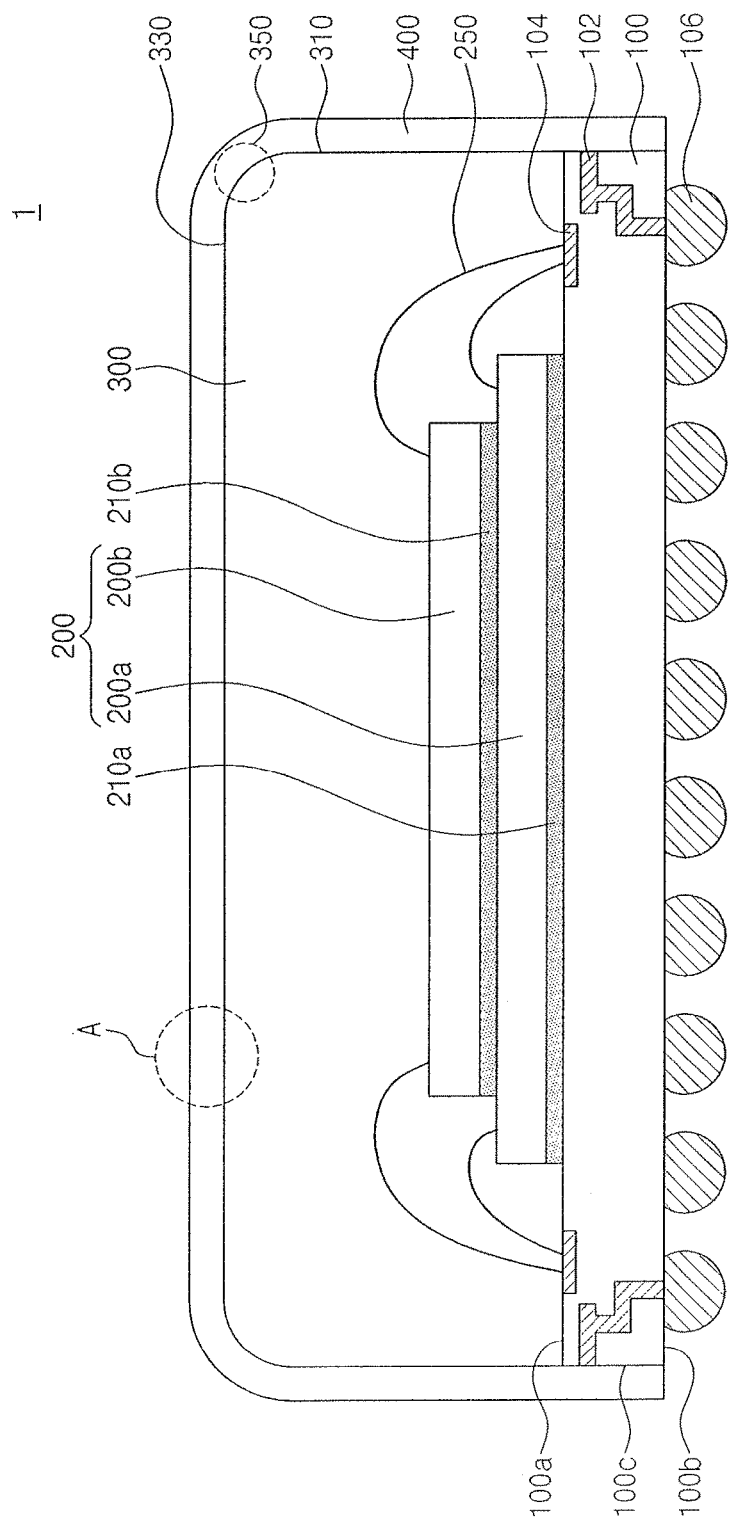
FIG. 1 illustrates a sectional view of a semiconductor package according to some embodiments.

Exemplary embodiments explained and illustrated herein include their complementary counterparts. The same reference numerals or the same reference designators denote the same elements throughout the specification.

FIG. 1 is a sectional view illustrating a semiconductor package according to some embodiments.

Referring to FIG. 1, a semiconductor package 1 may include a substrate 100, a semiconductor chip 200, a mold layer 300, and a shielding layer 400.

The substrate 100 may be, e.g., a printed circuit board (PCB) having two opposite surfaces (e.g., a top surface 100a and a bottom surface 100b). The substrate 100 may include a ground pattern 102 that is exposed through a side surface 100c of the substrate 100. A connection pad 104 may be provided on the top surface 100a of the substrate 100, and outer terminals 106 may be provided on the bottom surface 100b of the substrate 100. For example, the outer terminals 106 may be solder balls. The outer terminals 106 may be formed of or include an alloy containing at least one of tin (Sn), silver (Ag), copper (Cu), nickel (Ni), bismuth (Bi), indium (In), antimony (Sb), or cerium (Ce).

The semiconductor chip 200 may be mounted on the top surface 100a of the substrate 100. The semiconductor chip 200 may include a first semiconductor chip 200a, which is provided to be in contact with the substrate 100, and a second semiconductor chip 200b, which is disposed on the first semiconductor chip 200a. The first semiconductor chip 200a and the second semiconductor chip 200b may be connected to the substrate 100 through bonding wires. Each of the first and second semiconductor chips 200a and 200b may be at least one of, e.g., a logic chip, a memory chip, or any combination thereof. A first adhesive layer 210a may be provided between the top surface 100a of the substrate 100 and the first semiconductor chip 200a, and a second adhesive layer 210b may be provided between the first semiconductor chip 200a and the second semiconductor chip 200b.

The semiconductor chip 200 may be mounted on the substrate 100 in various other manners. For example, the semiconductor chip 200 and the substrate 100 may be electrically connected to each other in a flip-chip bonding manner, and in this case, bumps may be used instead of the adhesive layers. In another example, in the case where a semiconductor package includes a plurality of vertically-stacked semiconductor chips 200, the semiconductor chips 200 may be provided to have a through-silicon-via (TSV) structure of electrically connecting the semiconductor chips 200 to each other or to the substrate 100.

The mold layer 300 may be provided to cover the top surface 100a of the substrate 100 and the semiconductor chip 200. The mold layer 300 may have side surfaces 310, a top surface 330, and corner regions 350. The corner region 350 of the mold layer 300 may have a rounded shape. The mold layer 300 may be formed of or include an insulating polymer material (e.g., epoxy molding compound (EMC)).

The shielding layer 400 may be provided on the mold layer 300. The shielding layer 400 may be provided to cover, e.g., entirely, not only the side surfaces 310, the top surface 330, and the corner regions 350 of the mold layer 300, but also the side surface 100c of the substrate 100. The shielding layer 400 may be, e.g., directly, connected to the ground pattern 102 exposed by the side surface 100c of the substrate 100. For example, the shielding layer 400 may be formed of or include at least one of conductive magnetic materials or metallic magnetic materials. As an example, the conductive materials may include at least one of nickel (Ni), cobalt (Co), copper (Cu), gold (Au), cast iron, silicon iron, iron (Fe), mu-metal, permalloy, supermalloy, ferrite, nanoperm, carbon steel, and a martensitic stainless steel.

Since the corner regions 350 of the mold layer 300 have a rounded shape, it is possible to prevent a void from being formed between the mold layer 300 and the shielding layer 400, and to prevent the shielding layer 400 from being damaged near corners of the mold layer 300.

The shielding layer 400 may prevent electromagnetic waves from being incident into or emitted from EMI-sensitive electronic devices (e.g., mobile devices and computers). The shielding layer 400 may be connected to the ground pattern 102 of the substrate 100, thereby serving as a part of a closed circuit. The shielding layer 400 may be electrically connected to the ground pattern 102 of the substrate 100, and this may make it possible to allow an electromagnetic wave incident on the shielding layer 400 to be transmitted to the outside. Furthermore, since the shielding layer 400 is formed of a conductive material, it is possible to easily dissipate heat energy generated in the semiconductor package 1 to the outside.

Figure 2A:
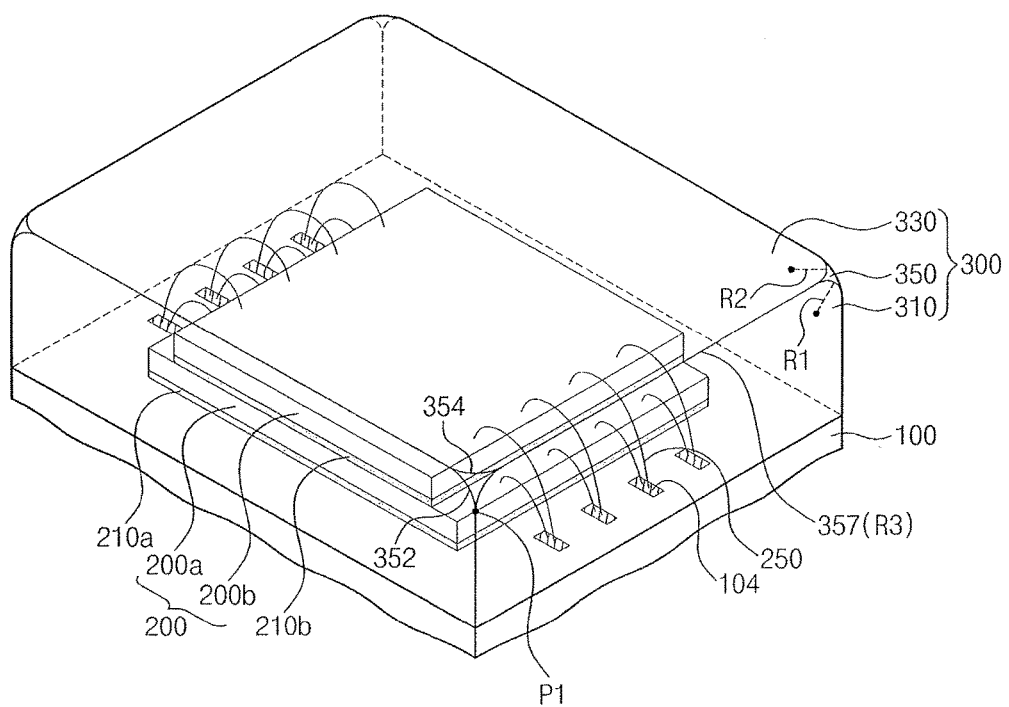
FIG. 2A illustrates a perspective view of a mold layer according to some embodiments.
Figure 2B:
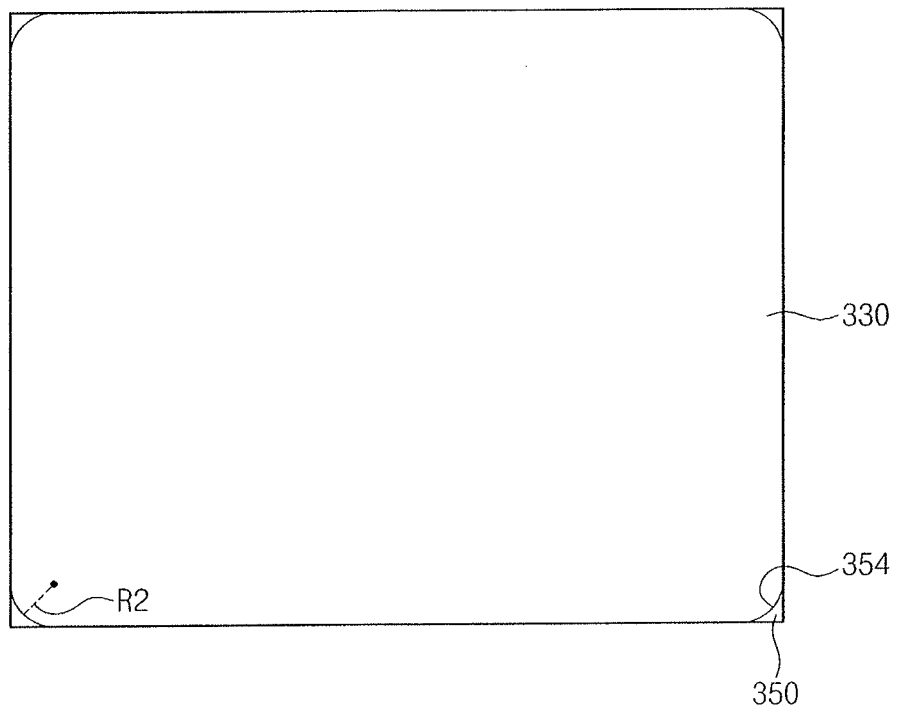
FIG. 2B illustrates a plan view of a mold layer according to some embodiments.
Figure 2C:
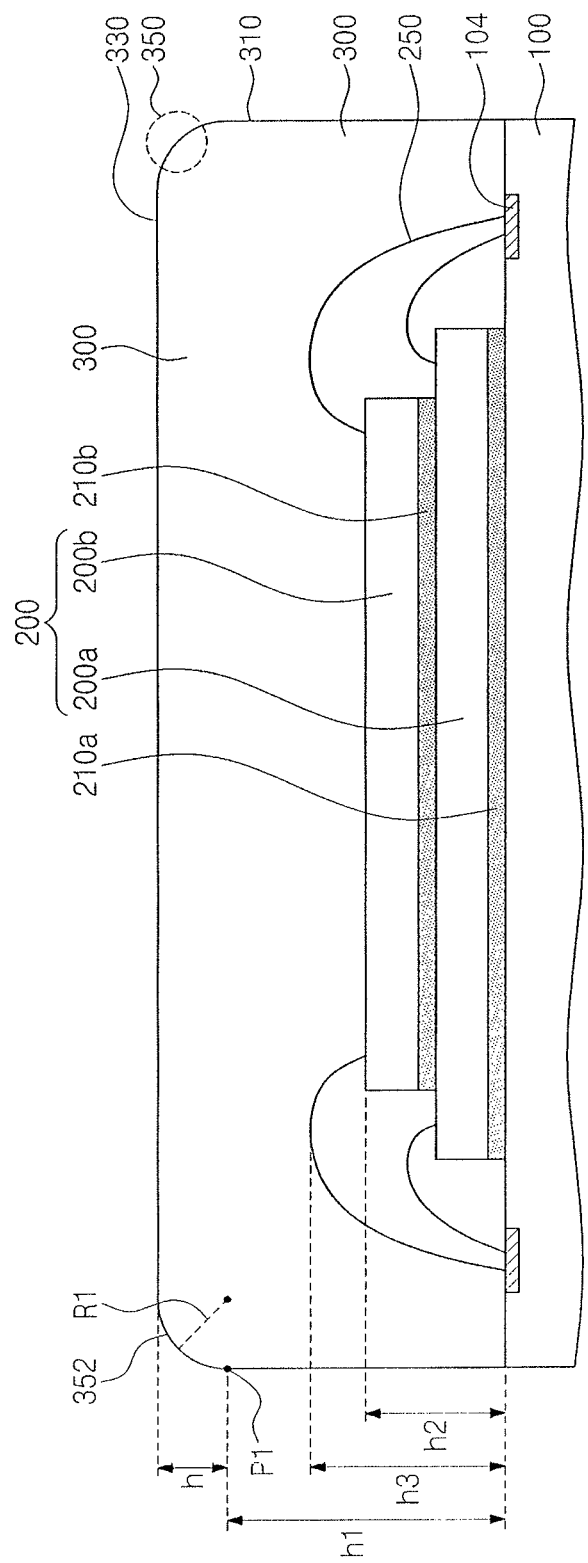
FIG. 2C illustrates a sectional view of a mold layer according to some embodiments.

FIGS. 2A, 2B, and 2C are perspective, plan, and sectional views, respectively, illustrating the mold layer 300 according to some embodiments.

Referring to FIG. 2A, the mold layer 300 may include the side surfaces 310, the top surface 330, and the corner region 350. The side surfaces 310 and the top surface 330 may be substantially flat, whereas the corner regions 350 may have a curved surface. The corner region 350 may be a region, at which an adjacent pair of the side surfaces 310 and the top surface 330 meet, e.g., converge with, each other.

Each corner region 350 may include a pair of first corners 352, which are respectively connected to the side surfaces 310, and a second corner 354, which is connected to the top surface 330. Each of the first corners 352 may be rounded to have a first curvature radius R1. Each of the first corners 352 may have a curved surface extending from a first point P1 toward the top surface 330. The first point P1 may be a point, at which the pair of the first corners 352 meet each other. The second corner 354 may be rounded to have a second curvature radius R2. The first curvature radius R1 may be greater than the second curvature radius R2.

Each of the side surfaces 310 may meet the top surface 330 at a corner 357. The corner 357 may be rounded to have a third curvature radius R3. The third curvature radius R3 may be smaller than the first and second curvature radii R1 and R2.

Referring to FIGS. 2B and 2C, the first corner 352 may be rounded to have the first curvature radius R1. The first curvature radius R1 may vary depending on a height h of the first corner 352. The height h of the first corner 352 may be defined as a distance between the first point P1 and the top surface 330 in a vertical direction. For example, the greater the height h of the first corner 352, the greater the first curvature radius R1.

The second corner 354 may be rounded to have the second curvature radius R2. The second curvature radius R2 may vary depending on the height h of the first corner 352. For example, the greater the height h of the first corner 352, the greater the second curvature radius R2. The second curvature radius R2 may be smaller than the first curvature radius R1.

The first point P1 may be positioned at a first height h1. The second semiconductor chip 200b may have a top surface positioned at a second height h2, and the topmost portion of a wire 250 may be positioned at a third height h3. The first point P1 may be positioned at a higher level than the top surface of the second semiconductor chip 200b and then the topmost portion of the wire 250. In other words, the first height h1 may be higher than each of the second and third heights h2 and h3.

Figure 3:
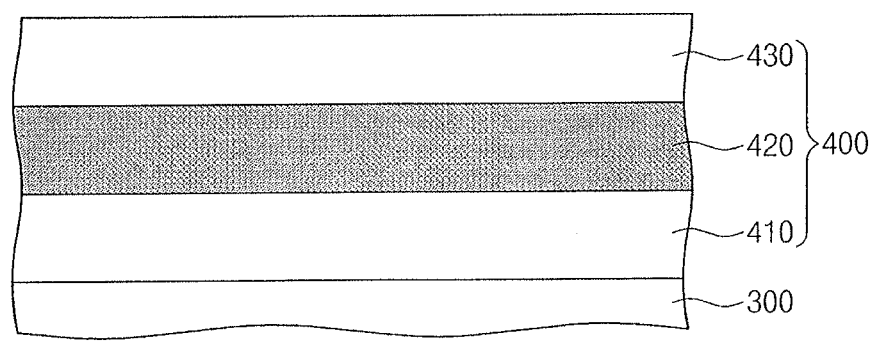
FIG. 3 illustrates an enlarged sectional view of a region 'A' of FIG. 1.

FIG. 3 is an enlarged sectional view of a region 'A' of FIG. 1.

Referring to FIG. 3, the shielding layer 400 may include an adhesive layer 410, a deposition primer 420, and a metal layer 430. The adhesive layer 410 may be formed of or include at least one of, e.g., polyester, polyurethanes, acrylic, ethylene co-vinyl acetate (EVA), or polyvinyl acetate (PVAc). The metal layer 430 and the mold layer 300 may be attached to each other by the adhesive layer 410. The metal layer 430 may be formed of or include at least one of conductive magnetic materials (e.g., metals). For example, the metal layer 430 may be formed of or include at least one of nickel (Ni), cobalt (Co), copper (Cu), gold (Au), cast iron, silicon iron, iron (Fe), mu-metal, permalloy, supermalloy, ferrite, nanoperm, carbon steel, or a martensitic stainless steel.

The deposition primer 420 may be provided between the adhesive layer 410 and the metal layer 430 to reinforce adhesion characteristics therebetween. The deposition primer 420 may be provided between the adhesive layer 410 and the metal layer 430 and/or on the metal layer 430, and in certain embodiments, only the adhesive and metal layers 410 and 430 may be provided on the mold layer 300 without the deposition primer 420. The deposition primer 420 may be formed of or include at least one of urethane-based or acrylic-based materials. For example, the deposition primer 420 may include, e.g., consist of, a main material, a hardening agent, and a solvent. The main material may be one of an unsaturated compound containing a hydroxyl group, unsaturated carbonic acid ester, unsaturated carbonic acid, unsaturated hydrocarbon, vinyl ester, and halogenated vinyl. The hardening agent may be a material containing, e.g., an isocyanate group. The solvent may be a material capable of dissolving the hardening agent.

FIGS. 4A to 4D are sectional views illustrating stages in a method of fabricating a semiconductor package, according to some embodiments. For concise description, a previously described element may be identified by a similar or identical reference number without repeating an overlapping description thereof.

Figure 4A:
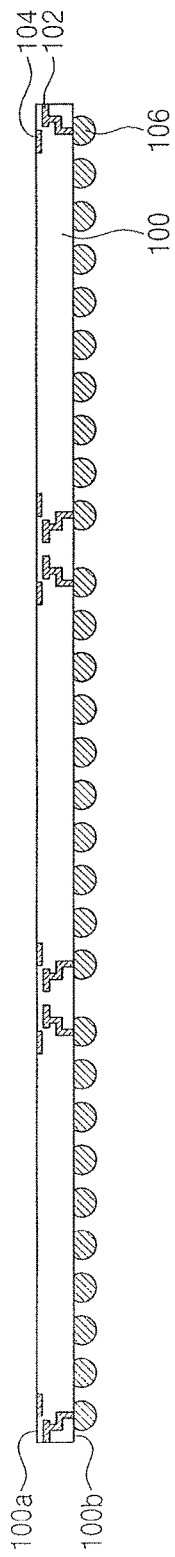
FIGS. 4A to 4D illustrate sectional views of stages in a method of fabricating a semiconductor package, according to some embodiments.

Referring to FIG. 4A, the substrate 100 with the ground patterns 102 and the connection pads 104 may be provided. In some embodiments, the substrate 100 may be in a stripped state. The substrate 100 may include the top surface 100a and the bottom surface 100b that are opposite to each other. The outer terminals 106 may be formed on the bottom surface 100b of the substrate 100.

Figure 4B:
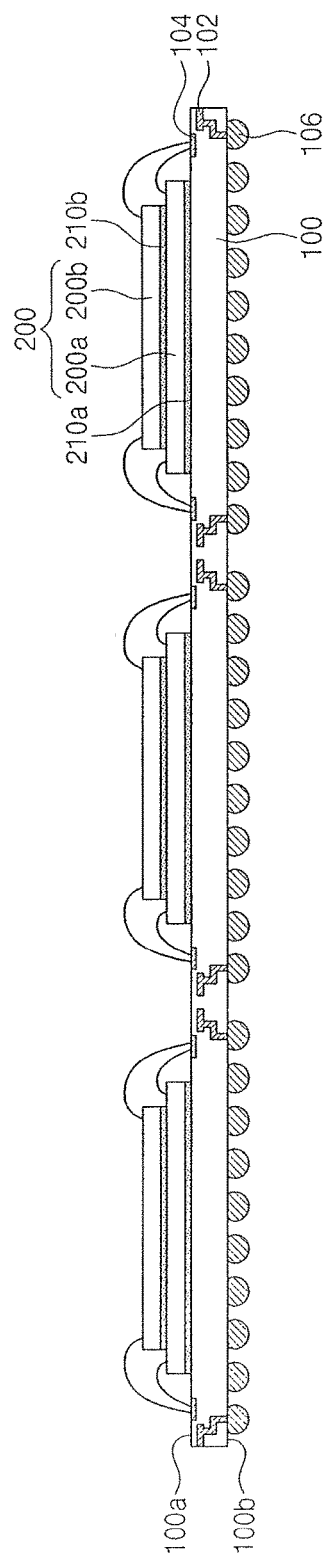

Referring to FIG. 4B, a plurality of the semiconductor chips 200 may be mounted on the substrate 100. The semiconductor chips 200 may include the first semiconductor chip 200a and the second semiconductor chip 200b. The first semiconductor chip 200a may be provided on the substrate 100, and the second semiconductor chip 200b may be provided on the first semiconductor chip 200a. The first semiconductor chip 200a and the second semiconductor chip 200b may be provided spaced apart from each other. The first and second semiconductor chips 200a and 200b may be electrically connected to the substrate 100 via the wires 250. In other words, the wires 250 may be provided to electrically connect the first and second semiconductor chips 200a and 200b to the connection pads 104.

Figure 4C:
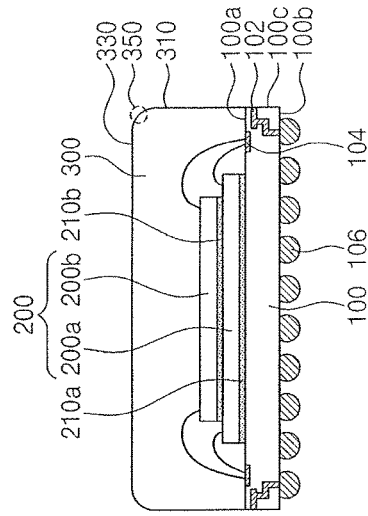

Referring to FIG. 4C, a cutting process may be performed on the substrate 100 to separate the plurality of semiconductor chips 200 stacked on the substrate 100 from each other. The cutting process may be performed using a saw blade or by a laser cutting method. Each of the cut pieces of the substrate 100 may have the side surface 100c exposing the ground pattern 102.

The mold layer 300 may be formed on each of the cut pieces of the substrate 100. The mold layer 300 may include the side surfaces 310, the top surface 330, and the corner regions 350. The formation of the mold layer 300 may include providing a mold with rounded corners, e.g., with curvatures R1 through R3 as described previously, injecting a molding material into the mold, and applying the mold with the molding material to the cut pieces of the substrate 100 with the semiconductor chips 200. The molding material may include an insulating polymer material (e.g., epoxy molding compound (EMC)). In another example, cutting the substrate 100 to separate the plurality of semiconductor chips 200 may be performed after forming the mold layers 300.

Figure 4D:
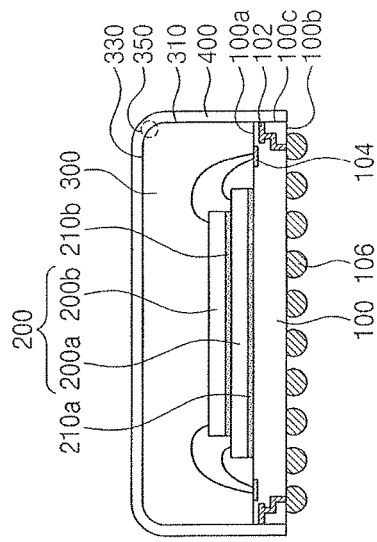

Referring to FIG. 4D, the shielding layer 400 may be formed to cover the mold layer 300. The shielding layer 400 may be formed to cover not only the side surfaces 310, the top surface 330, and the corner regions 350 of the mold layer 300 but also the side surface 100c of the substrate 100. The shielding layer 400 may be formed by a sputtering process, a metal spray process, an electroplating process, an electroless-plating process, or a shielding film transfer process. The shielding layer 400 may be formed of or include at least one of conductive magnetic materials or metallic magnetic materials. For example, the shielding layer 400 may be formed of or include at least one of nickel (Ni), cobalt (Co), copper (Cu), gold (Au), cast iron, silicon iron, iron (Fe), mu-metal, permalloy, supermalloy, ferrite, nanoperm, carbon steel, or a martensitic stainless steel. The resulting structure provided with the shielding layer 400 may be used as the semiconductor packages 1 of FIG. 1.

FIGS. 5A to 5E are sectional views illustrating a method of forming the shielding layer 400, according to some embodiments. FIGS. 5A to 5E illustrate a method of forming the shielding layer 400 using a shielding film transfer process. For concise description, a previously described element may be identified by a similar or identical reference number without repeating an overlapping description thereof.

Figure 5A:
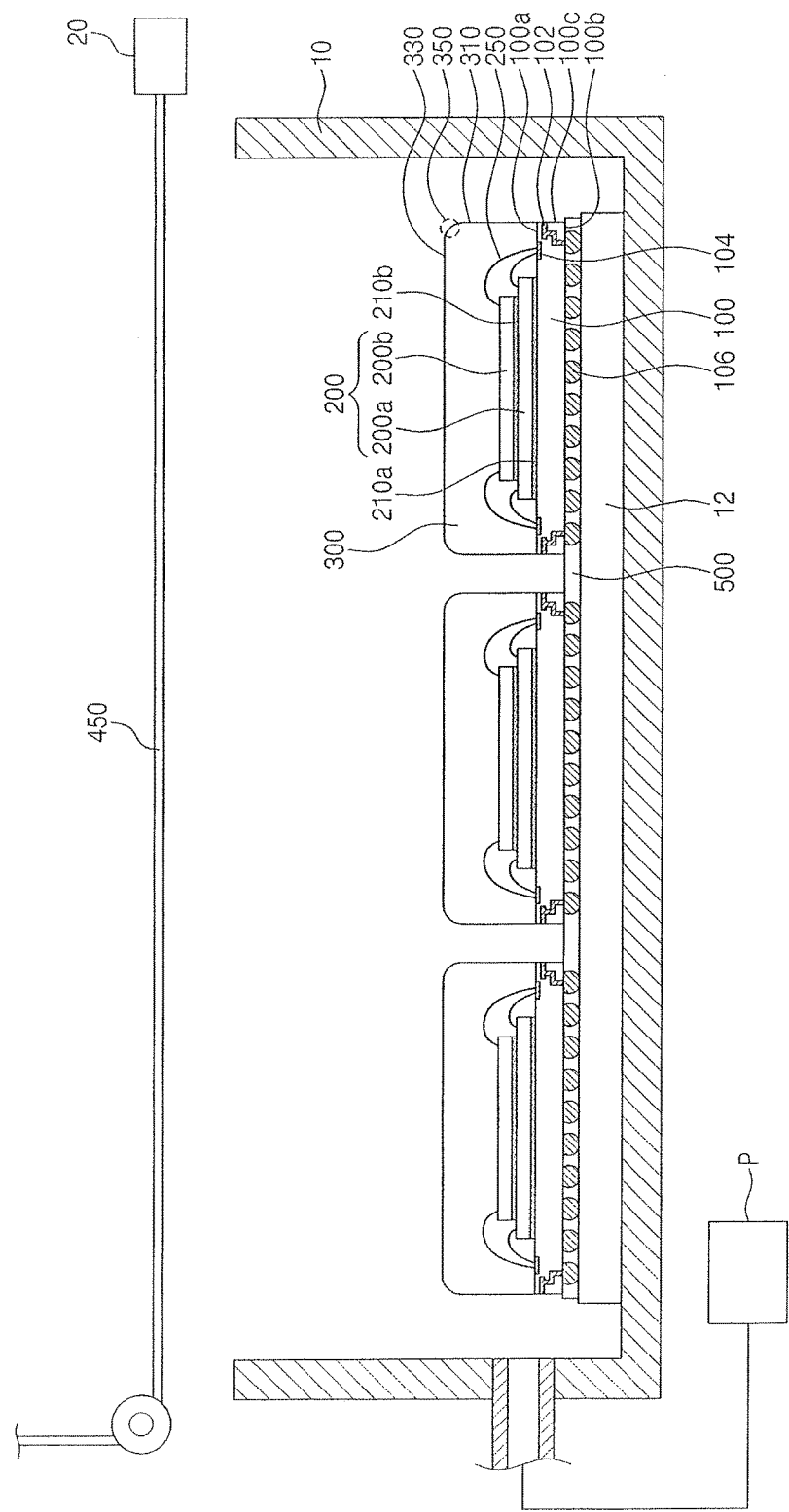
FIGS. 5A to 5E illustrate sectional views of stages in a method of forming a shielding layer, according to some embodiments.

Referring to FIG. 5A, a jig 12 may be provided in a chamber 10, and a plurality of the substrates 100 with the mold layer 300 may be disposed on the jig 12. A protection layer 500 may be formed on the bottom surfaces 100b of the substrates 100 to cover the outer terminals 106. A delivery apparatus 20 for delivering the shielding film may be provided on the chamber 10. The delivery apparatus 20 may be used to unfold a shielding film 450 over an opened, e.g., top, region of the chamber 10. For example, as illustrated in FIG. 5A, the shielding film 450 may be unfolded to cover, e.g., overlap, an entirety of the top opening of the chamber 10, such that the shielding film 450 overlaps continuously and simultaneously all the cut pieces of the substrate 100 with their corresponding mold layers 300.

Figure 5B:
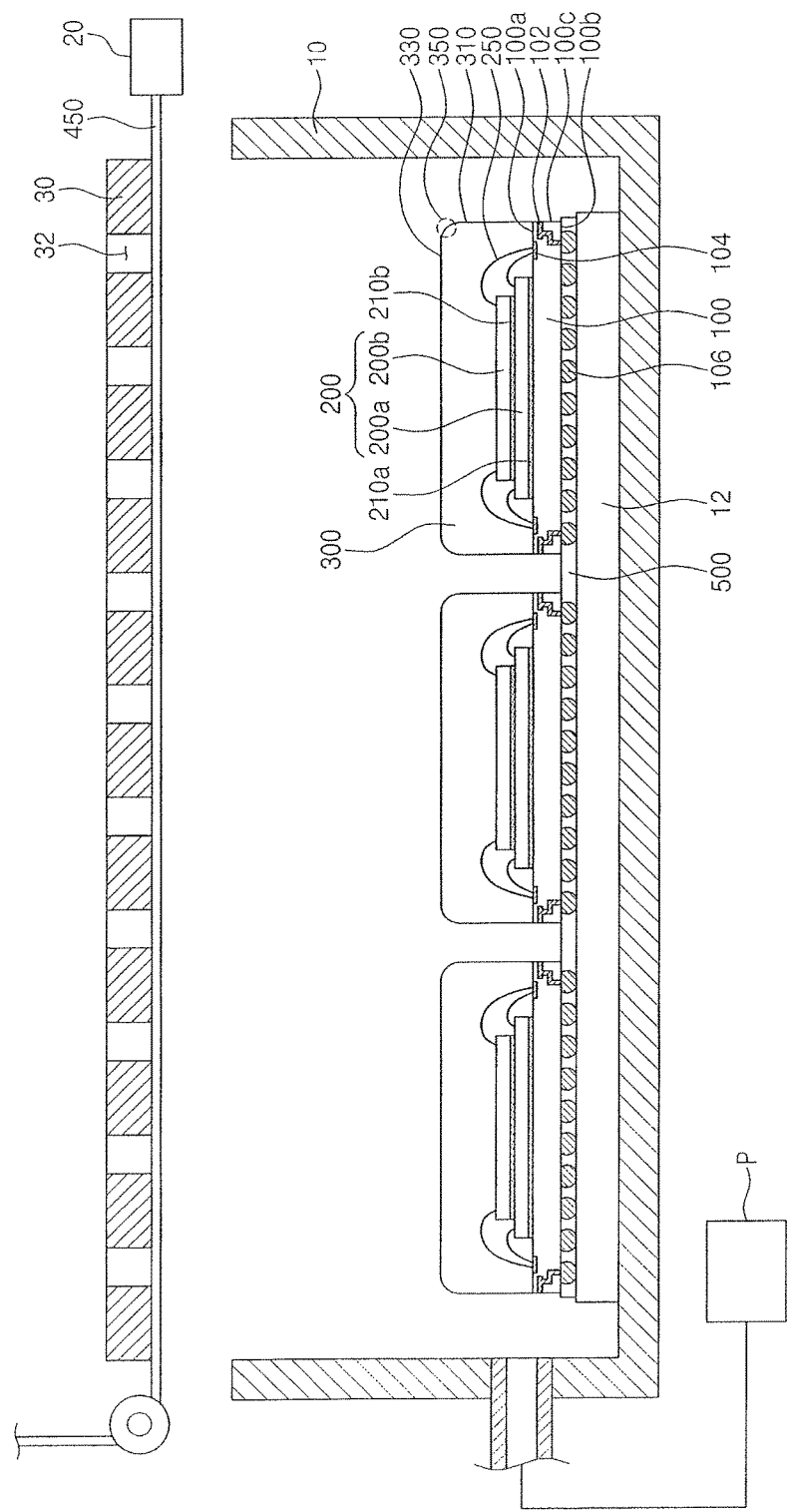

Referring to FIG. 5B, a heating plate 30 may be provided on the shielding film 450. The heating plate 30 may include a plurality of holes 32. The holes 32 may be used to exhaust air from a space between the heating plate 30 and the shielding film 450, and this may make it possible to allow the heating plate 30 to be in close, e.g., direct, contact with the shielding film 450. The heating plate 30 may heat up the shielding film 450 to a process temperature of about 120°. As a result of the heating, the shielding film 450 may be in a fluid state, e.g., the shielding film 450 may be in a fluid state (e.g., non-fixed state such as gel) while being held to the heating plate 30 (e.g., by exhaust).

Figure 5C:
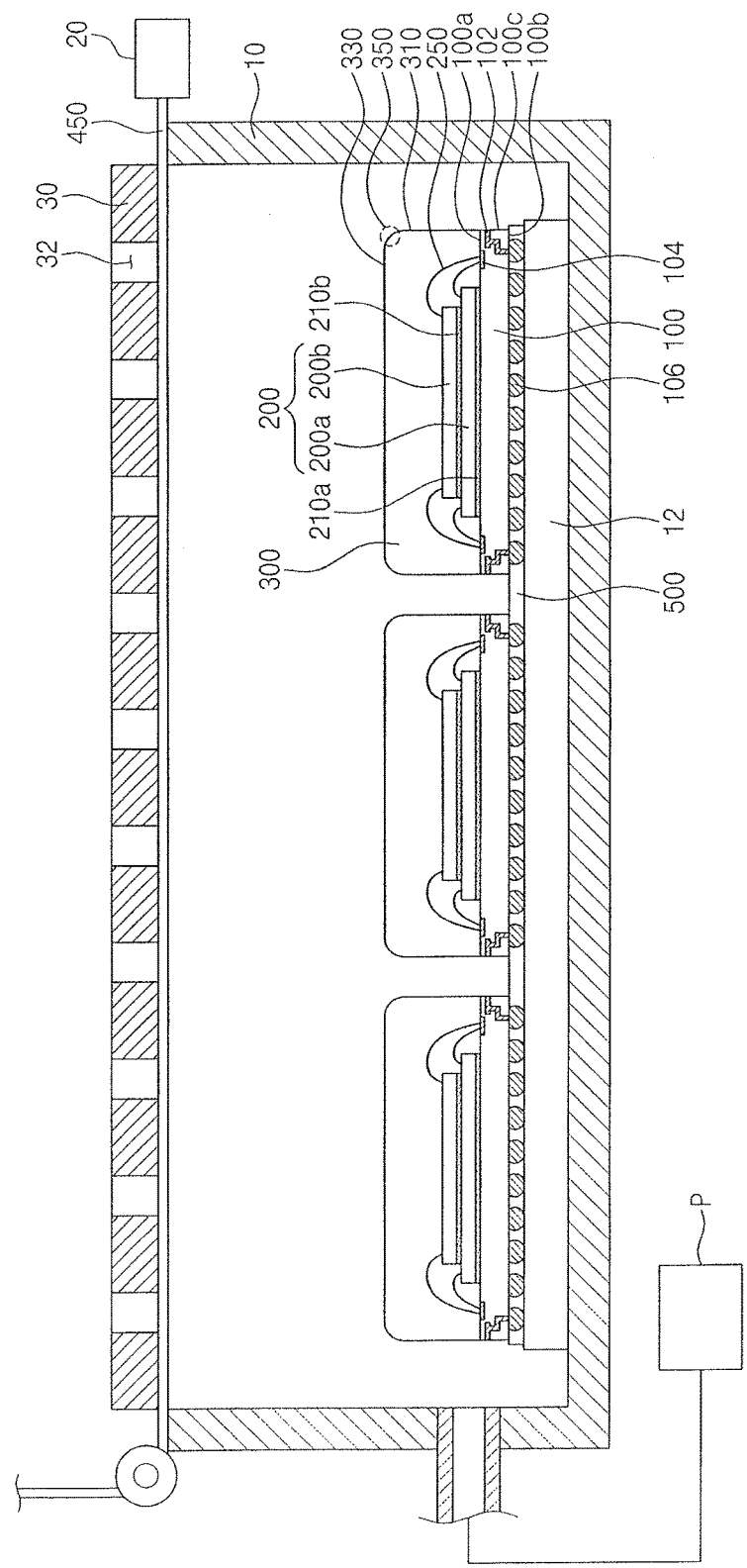

Referring to FIG. 5C, the shielding film 450, the heating plate 30, and the delivery apparatus 20 may be lowered, e.g., together, to cover the opened region of the chamber 10. The heating plate 30 and the delivery apparatus 20 may be placed to close, e.g., completely seal, the opened region of the chamber 10. For example, as illustrated in FIG. 5C, a bottom surface of the shielding film 450 may contact a top surface of a sidewall of the chamber 10. As a result, the chamber 10 may be in a sealed state. Thereafter, a pump P may be used to decrease an internal pressure of the chamber 10 (e.g., to a vacuum pressure).

Figure 5D:
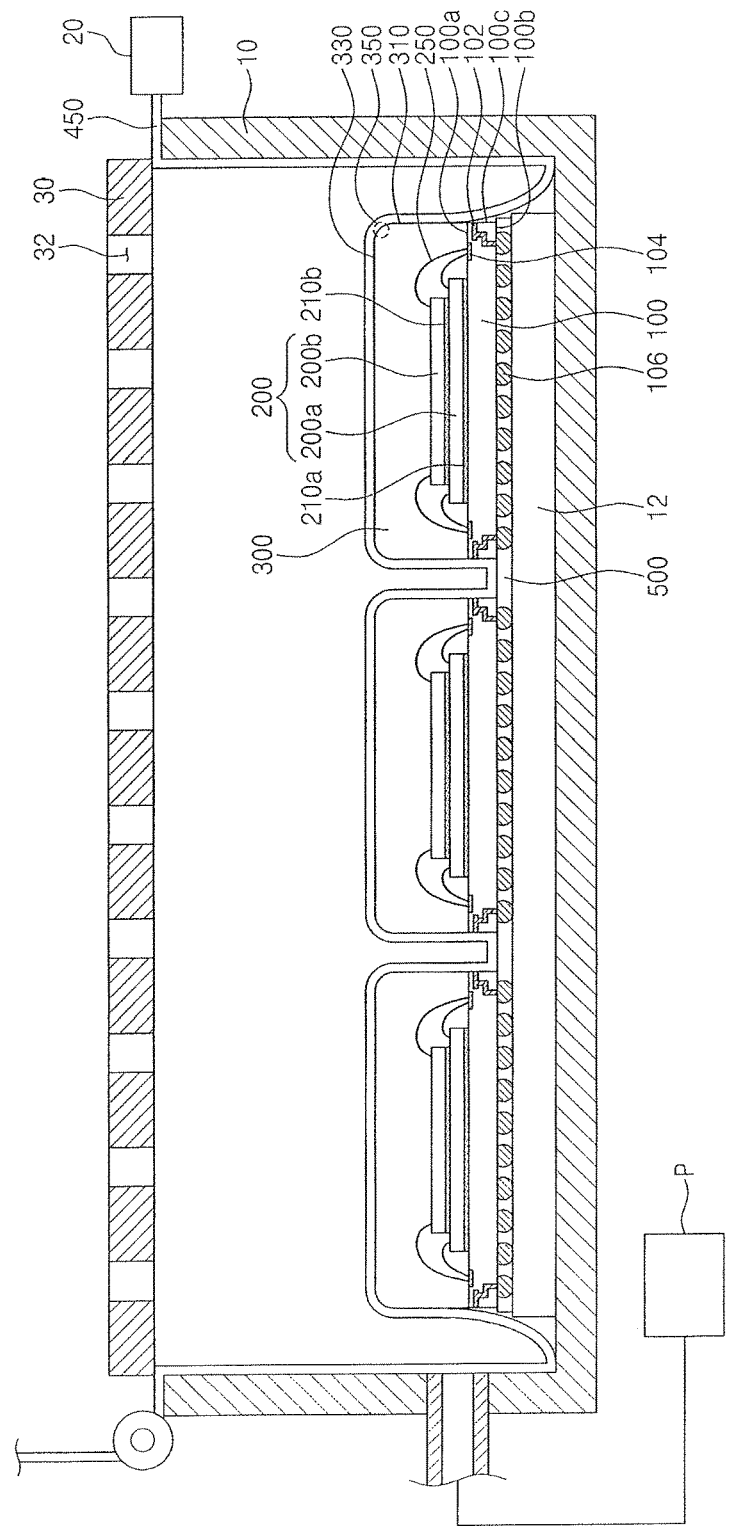

Referring to FIG. 5D, air may be supplied into the chamber 10 through the holes 32 to transfer the shielding film 450 onto the mold layers 300. For example, as illustrated in FIG. 5D, the air may push the shielding film 450 from the heating plate 30 toward the mold layers 300, until the shielding film 450 coats, e.g., conformally, all the mold layers 300 in the chamber 10. The air may be supplied to increase the internal pressure of the chamber 10 to about 2.4 MPa or less. In the case where the internal pressure of the chamber 10 is increased, the shielding film 450 may be in close, e.g., direct, contact with the mold layer 300. The shielding film 450 may be provided between the mold layers 300 and between the side surfaces 100c of the substrates 100.

Figure 5E:
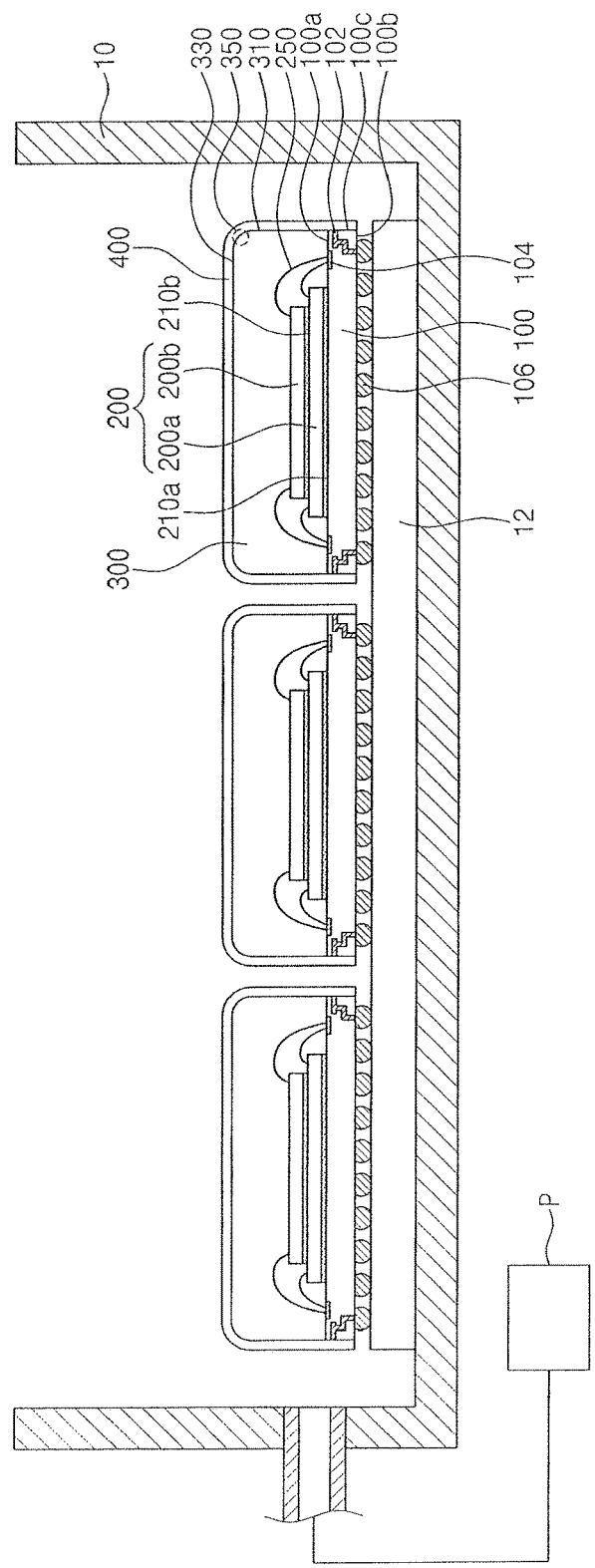

Referring to FIG. 5E, the heating plate 30 and the delivery apparatus 20 may be elevated, and thus, the internal pressure of the chamber 10 may be increased to the atmospheric pressure. Thereafter, a cutting process may be performed to remove a portion of the shielding film 450 that does not cover the mold layers 300. As a result of the cutting process, the shielding layer 400 may be localized to cover the side surfaces 310, the top surface 330, and the corner regions 350 of each of the mold layer 300. The shielding film 450 may be cured to finalize the shielding layer 400. The semiconductor packages 1 of FIG. 1 may be formed by removing the protection layer 500 from the bottom surfaces 100b of the substrates 100.

According to some embodiments, since the shielding layer 400 is formed by transferring the shielding film 450 onto the mold layer 300 with the corner regions 350, it is possible to prevent a void from being formed between the shielding layer 400 and the mold layer 300.

Figure 6A:
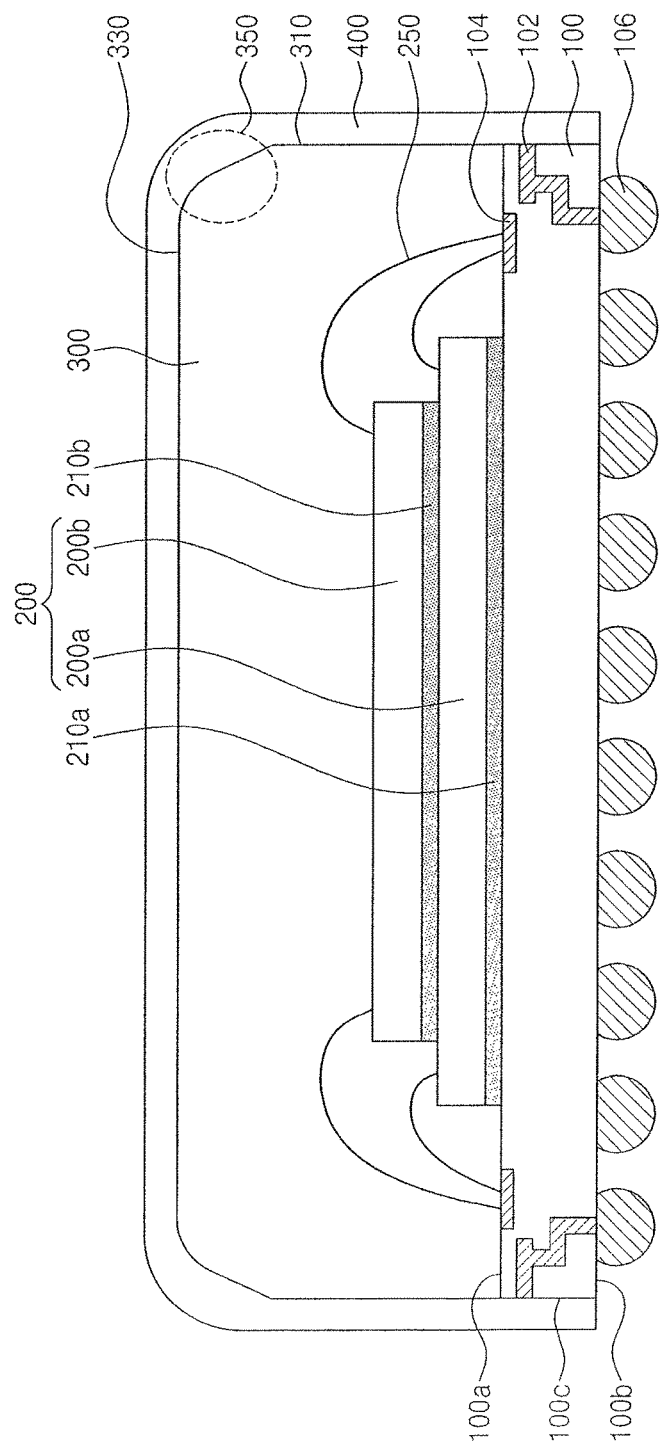
FIG. 6A illustrates a sectional view illustrating a semiconductor package according to some embodiments.
Figure 6B:
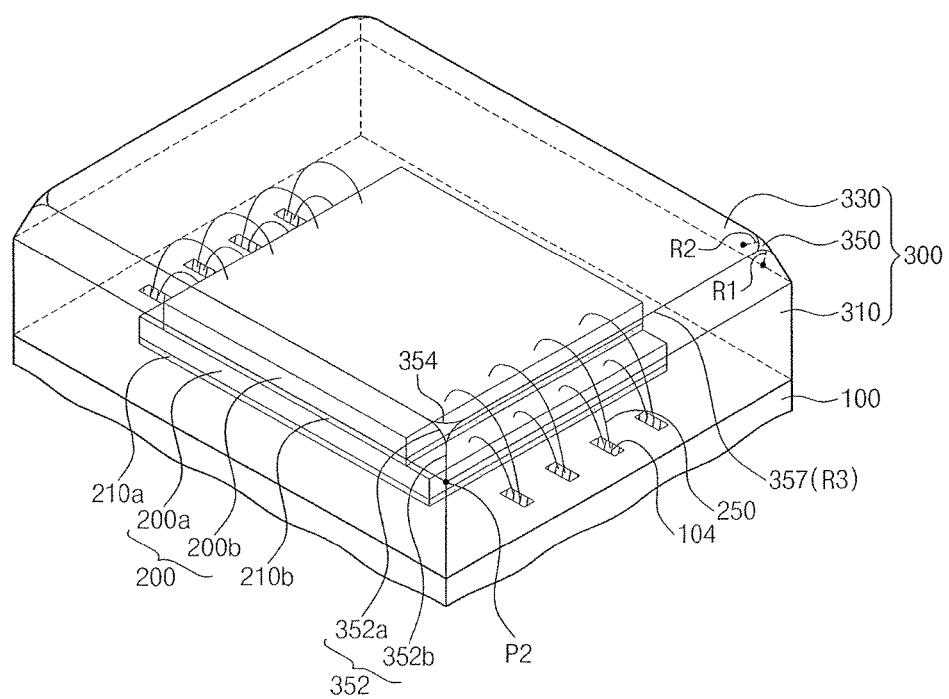
FIG. 6B illustrates a perspective view of a mold layer according to some embodiments.
Figure 6C:
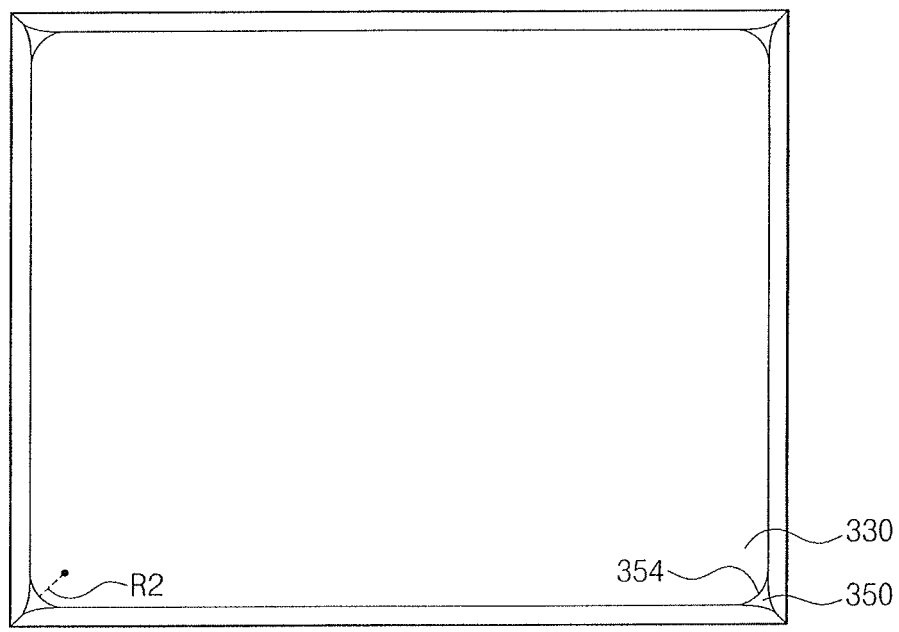
FIG. 6C illustrates a plan view of a mold layer according to some embodiments.
Figure 6D:
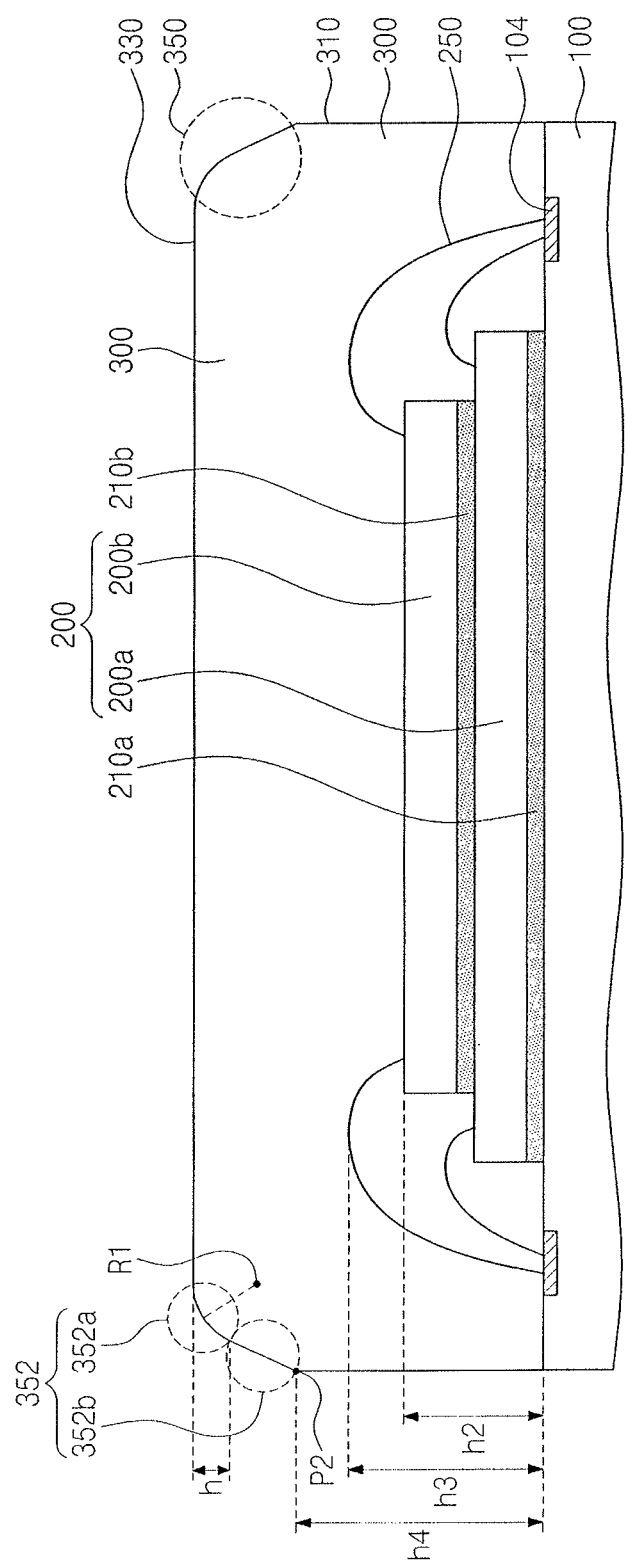
FIG. 6D illustrates a sectional view of a mold layer according to some embodiments.

FIG. 6A is a sectional view illustrating a semiconductor package according to some embodiments, and FIGS. 6B, 6C, and 6D are perspective, plan, and sectional views, respectively, illustrating a mold layer according to some embodiments. For concise description, a previously described element may be identified by a similar or identical reference number without repeating an overlapping description thereof.

Referring to FIGS. 6A to 6D, the mold layer 300 may include the side surfaces 310, the top surface 330, and the corner regions 350. Each of the corner regions 350 may include a pair of first corners 352, which are respectively connected to the side surfaces 310, and a second corner 354, which is connected to the top surface 330. Each of the first corners 352 may include an upper region 352a and a lower region 352b. The upper region 352a may be adjacent to the top surface 330, compared with the lower region 352b, e.g., the upper region 352a may connect to the top surface 330 to the lower region 352b.

In detail, the upper region 352a may be rounded to have the first curvature radius R1. The first curvature radius R1 may vary depending on a height h of the upper region 352a. The height h of the upper region 352a may be defined as a distance between boundary of the upper region 352a and the lower region 352b and the top surface 330 in a vertical direction. For example, the greater the height h of the upper region 352a, the greater the first curvature radius R1. The lower region 352b may be inclined at a, e.g., constant, angle with respect to a vertical direction normal to the top surface 100a of the substrate 100. For example, the inclined angle of the lower region 352b relative to the vertical direction may be greater than 0° and equal to or smaller than 60°. The lower region 352b may extend from a second point P2 toward the top surface 330. The lower region 352b may meet each other at the second point P2. The second corner 354 may be rounded to have a second curvature radius R2. The second curvature radius R2 may be smaller than the first curvature radius R1. The second curvature radius R2 may vary depending on the height h of the upper region 352a. For example, the greater the height h of the upper region 352a, the greater the second curvature radius R2.

The second point P2 may be positioned at a fourth height h4. The second semiconductor chip 200b may have a top surface positioned at a second height h2, and the topmost portion of a wire 250 may be positioned at a third height h3. The second point P2 may be positioned at a higher level than each of the top surface of the second semiconductor chip 200b and the topmost portion of the wire 250. In other words, the fourth height h4 may be higher than each of the second and third heights h2 and h3.

Corners 357 may be formed between each of the side surfaces 310 and the top surface 330. Each of the corners 357 may be rounded to have a third curvature radius R3. The third curvature radius R3 may be smaller than the first and second curvature radii R1 and R2. Unlike the examples described with reference to FIGS. 1-5E, the second curvature radius R2 may be equal to or greater than the first curvature radius R1.

By way of summation and review, according to some embodiments, a shielding layer may be provided on a semiconductor package to protect the semiconductor package from an electromagnetic wave. That is, a mold layer may be provided to have a rounded corner. Since the corner of the mold layer has a rounded shape, it is possible to prevent the shielding layer from being damaged by the corner of the mold layer. In addition, the shielding layer may be formed by a method of transferring a shielding film onto the mold layer, and this may make it possible to prevent a void from being formed between the mold layer and the shielding layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package comprising:
   a substrate;
   a first semiconductor chip mounted on an upper surface of the substrate;
   a mold layer covering the first semiconductor chip, the mold layer including a plurality of side surfaces, a top surface and a plurality of corner regions, each of the corner regions including a first corner formed on one of the plurality of side surfaces of the mold layer and a second corner formed on top surface of the mold layer; and
   a shielding layer formed on the mold layer,
   wherein the first corner includes an upper region and a lower region, the upper region is rounded to have a first curvature radius, and the lower region which is inclined at a first angle to a direction normal to the substrate, and the first angle is greater than 0° and equal to or smaller than 60°.

2. The semiconductor package of claim 1, wherein a lowermost portion of the lower region is positioned at a higher level than the top surface of the first semiconductor chip.

3. The semiconductor package of claim 1, wherein the second corner is rounded to have a second curvature radius, and the second curvature radius is smaller than the first curvature radius.

4. The semiconductor package of claim 1, wherein the shielding layer includes an adhesive layer and a metal layer, the metal layer being formed of at least one of nickel (Ni), cobalt (Co), copper (Cu), gold (Au), cast iron, silicon iron, iron (Fe), mu-metal, permalloy, supermalloy, ferrite, nanocrystalline iron, carbon steel, and a martensitic stainless steel.

5. The semiconductor package of claim 4, wherein the shielding layer further includes an deposition primer between the adhesive layer and the metal layer to reinforce adhesion characteristics therebetween.

6. The semiconductor package of claim 5, wherein the deposition primer include at least one of urethane-based and acrylic-based materials.

7. The semiconductor package of claim 1, wherein the semiconductor package further includes a second semiconductor chip stacked on the first semiconductor chip.

8. The semiconductor package of claim 7, wherein both the first semiconductor chip and the second semiconductor chip are electrically connected to the substrate through wires.

9. The semiconductor package of claim 8, wherein an uppermost portion of a wire electrically connecting the second semiconductor chip to the substrate is positioned lower than lowest portion of the lower region.

10. The semiconductor package of claim 1, wherein the shielding layer formed on the mold layer covers the top surface, the side surfaces, and the corner regions of the mold layer, and the shielding layer further covers side surfaces of the substrate.

11. The semiconductor package of claim 1, wherein the substrate includes a plurality of solder balls on a bottom surface of the substrate.

12. The semiconductor package of claim 11, wherein
the first semiconductor chip is electrically connected to the substrate through wires; and
at least one of the solder balls are electrically connected to one of the wires through internal conductive lines included in the substrate.

13. The semiconductor package of claim 1, wherein a first portion of the shielding layer disposed at corners of the mold layer is thicker than a second portion of the shielding layer disposed at top surface or side surfaces of the mold layer.

14. A method of fabricating a semiconductor package, the method comprising:
mounting a semiconductor chip on a substrate in a stripped state;
forming a mold layer to cover the semiconductor chip, the mold layer including a plurality of side surfaces, a top surface and a plurality of corner regions, each of the corner regions including a first corner formed on one of the plurality of side surfaces of the mold layer and a second corner formed on top surface of the mold layer;
providing a shielding film above the mold layer;
disposing a heating plate over the shielding film, thereby heating the shielding film; and
applying pressure toward the shielding film from or through the heating plate, thereby conformally coating the mold layer with the shielding film,
wherein the first corner includes an upper region and a lower region, the upper region is rounded to have a first curvature radius, and the lower region which is inclined at a first angle to a direction normal to the substrate, and the first angle is greater than 0° and equal to or smaller than 60°.

15. The method of claim 14, wherein a lowermost portion of the lower region is positioned at a higher level than the top surface of the semiconductor chip.

16. The method of claim 14, wherein the second corner is rounded to have a second curvature radius, and the second curvature radius is smaller than the first curvature radius.

17. The method of claim 14, wherein applying pressure toward the shielding film includes supplying air to the shielding film through a plurality of holes formed on the heating plate.

18. The method of claim 17, wherein the heating the shielding film includes applying heat energy toward the shielding film from the heating plate, and thereby allowing the shielding film to be in a fluid state.

19. The method of claim 14, wherein the shielding film includes an adhesive layer and a metal layer, the metal layer being formed of at least one of nickel (Ni), cobalt (Co), copper (Cu), gold (Au), cast iron, silicon iron, iron (Fe), mu-metal, permalloy, supermalloy, ferrite, nanocrystalline iron, carbon steel, or a martensitic stainless steel.

20. The method of claim 14, wherein the coated shielding film on the mold layer covers the top surface, the side surfaces, and the corner regions of the mold layer, and the coated shielding film further covers side surfaces of the substrate.

* * * * *